(12) United States Patent
Hopper et al.

(10) Patent No.: US 6,806,165 B1
(45) Date of Patent: Oct. 19, 2004

(54) ISOLATION TRENCH FILL PROCESS

(75) Inventors: Dawn M. Hopper, San Jose, CA (US); Minh V. Ngo, Fremont, CA (US); Mark S. Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 130 days.

(21) Appl. No.: 10/120,116

(22) Filed: Apr. 9, 2002

(51) Int. Cl.$^7$ ............................................... H01L 21/76

(52) U.S. Cl. ..................................................... 438/435

(58) Field of Search ................................ 438/424, 435

(56) References Cited

U.S. PATENT DOCUMENTS

| | | | | |
|---|---|---|---|---|
| 6,187,651 | B1 * | 2/2001 | Oh ............................. | 438/435 |
| 6,228,742 | B1 * | 5/2001 | Yew et al. .................. | 438/400 |
| 6,297,128 | B1 * | 10/2001 | Kim et al. .................. | 438/437 |
| 6,326,282 | B1 * | 12/2001 | Park et al. .................. | 438/424 |
| 6,441,426 | B1 * | 8/2002 | Fukumoto et al. .......... | 257/315 |

OTHER PUBLICATIONS

Stanley Wolf Silicon Processing for the VSLI ERA vol. 1 Lattice Press 2000 pp. 795–796.*
Stanley Wolf Silicon Processing for the VSLI ERA vol. 1 Lattice Press 1986 pp. 171–173 and 191–193.*
John Vossen Thin Film Processing Academic Press 1978 p. 54.*

* cited by examiner

Primary Examiner—David S Blum
(74) Attorney, Agent, or Firm—Winstead Sechrest & Minick P.C.

(57) ABSTRACT

A method for filling an isolation trench structure during a semiconductor fabrication process is disclosed. The method includes a two-step deposition process that includes depositing a silicon-rich liner on the trench surface, and thereafter, filling the isolation trenches with an oxide utilizing a biased high density plasma deposition process. In a preferred embodiment, the silicon-rich liner is an in-situ HDP liner having a thickness of between 100 and 400 Angstroms, and preferably 200 Angstroms. Depositing a silicon-rich liner on the trench surface prior to depositing the high density plasma oxide eliminates the formation of defects at the surface of the isolation trench structure. Thus, the quality of the oxide fill is improved, as is yield and device performance.

9 Claims, 6 Drawing Sheets

ISOLATION TRENCH FILL PROCESS

FIELD OF THE INVENTION

The present invention relates to semiconductor processing, and more particularly to a method for filling isolation trenches during semiconductor processing.

BACKGROUND OF THE INVENTION

During the fabrication of semiconductor devices, isolation trenches are provided between active areas where transistors will be located. The trenches extend into a silicon substrate and are filled with an insulating material, such as oxide, to form lines of oxide insulating regions. As the aspect-ratio for the isolation trench structure increases, it becomes increasingly more difficult to fill the trench without forming voids in the oxide near the center of the trench. The consistency of void-free gap fill has a significant effect on the subsequent integration process steps and on final device yield and performance.

Current techniques for gap filling the isolation trenches utilize a high density plasma ("HDP") deposition technique to produce a high-quality oxide filler. With HDP processing, high-aspect-ratio sub-half micron structures can be filled and locally planarized in a single processing step. Generally, ions and electrons from the plasma are generated at an electrode by means of an RF biasing power, and an RF power source is applied to another electrode (located at a holder for a wafer) to create a significant ion bombardment (sputter-etching) component during deposition. Thus, gap filling using HDP is a simultaneous deposition/etching process. This process allows trench isolation structures with high-aspect-ratios to be filled with high-quality oxide dielectric.

While HDP deposition of the oxide has been found to produce a high-quality void-free gap fill, it has been observed that deposition of the oxide is not uniform and, in some circumstances, completely lacking in some portions of the isolation trench line. This observed defect is illustrated in FIGS. 1A, 1B and 1C. FIG. 1A illustrates a view looking down onto the substrate surface 10. One of a plurality of isolation trench lines 24a is illustrated after the HDP oxide 30 has been deposited and polished back. The defect 40 is an unfilled area of the isolation trench 24a. FIGS. 1B and 1C illustrate cross-sectional views of the defect 40 at A—A, and B—B, respectively. As is shown in FIGS. 1B and 1C, the unfilled pockets occur at the isolation trench surface 50 (FIG. 1B) and can grow to encompass the entire isolation trench 24a (FIG. 1C). This defect 40 can significantly effect final device yield and performance.

Accordingly what is needed is an improved isolation trench fill process that produces a defect-free insulating layer. The present invention addresses such a need.

SUMMARY OF THE INVENTION

The present invention provides a method for filling an isolation trench structure during a semiconductor fabrication process. The method includes a two-step deposition process that includes depositing a silicon-rich liner on the trench surface, and thereafter, filling the isolation trenches with an oxide utilizing a biased high density plasma deposition process. In a preferred embodiment, the silicon-rich liner is an in-situ HDP liner having a thickness of approximately 200 Angstroms.

According to the method disclosed herein, depositing a silicon-rich liner on the trench surface prior to depositing the high density plasma oxide eliminates the formation of bubbles at the surface of the isolation trench structure. Thus, the quality of the oxide fill is improved, as is yield and device performance.

DETAILED DESCRIPTION

The present invention relates to a two-step isolation trench fill process. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides an isolation trench fill process for use during semiconductor fabrication. In a preferred embodiment of the present invention, the isolation trench fill process is used during the fabrication of flash memory arrays in which shallow trench isolation structures are formed between active regions of the semiconductor device.

Figure 2:
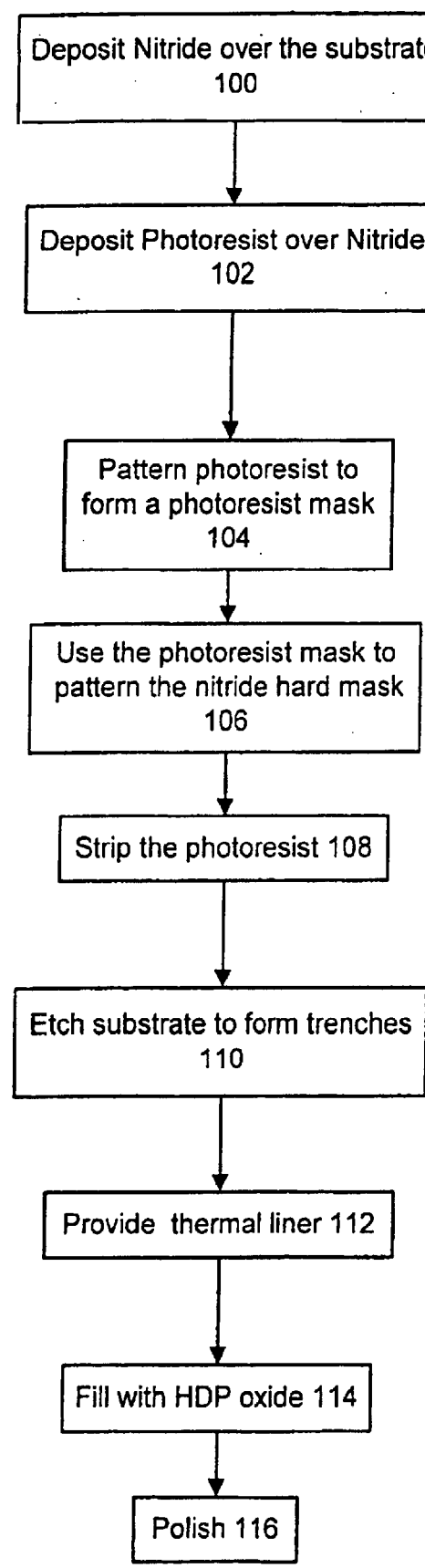
FIG. 2 is a flow chart illustrating conventional fabrication steps used to provide isolation trenches.
Figure 3A:
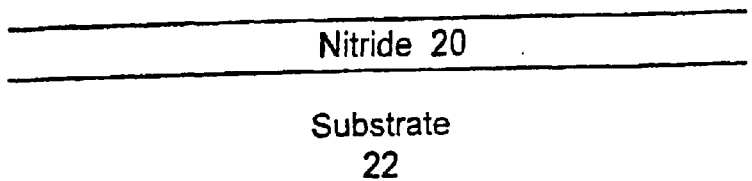
FIGS. 3A–3G are cross-sectional views of the silicon substrate during the fabrication steps described in FIG. 1.
Figure 3B:
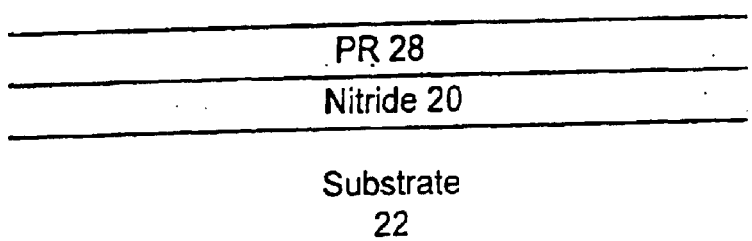
Figure 3C:
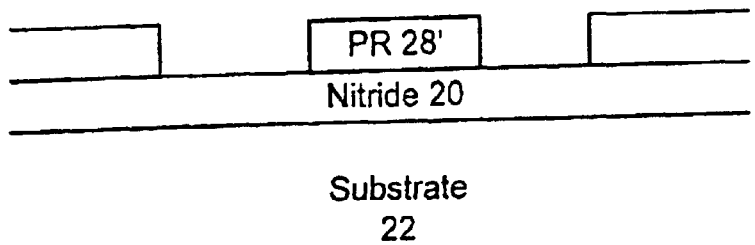
Figure 3D:
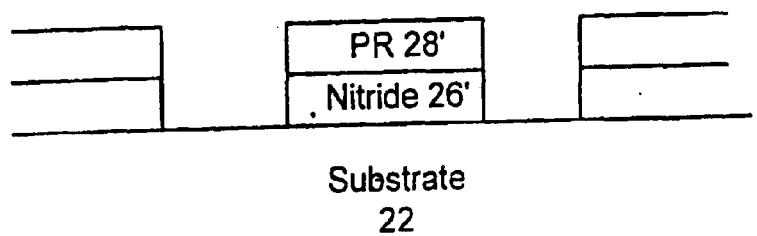

FIG. 2 is a flow chart illustrating the conventional fabrication steps used to produce isolation trenches. FIGS. 3A–3G are cross-sectional views of the silicon substrate during the fabrication steps described in FIG. 2. The process begins by depositing a layer of nitride 20, or other such material, over a silicon substrate 22 in step 100 to eventually form a hard mask. After the nitride 20 is deposited, a layer of photoresist 28 is deposited over the nitride 20 in step 102 (FIG. 3B). The photoresist 28 is then patterned in step 104 to form a photoresist mask 28' (FIG. 3C). The photoresist mask 28' is then used to pattern the nitride hard mask 26' in step 106 (FIG. 3D). After the nitride hard mask 26' has been patterned, the photoresist 28 is stripped in step 108.

Figure 3E:
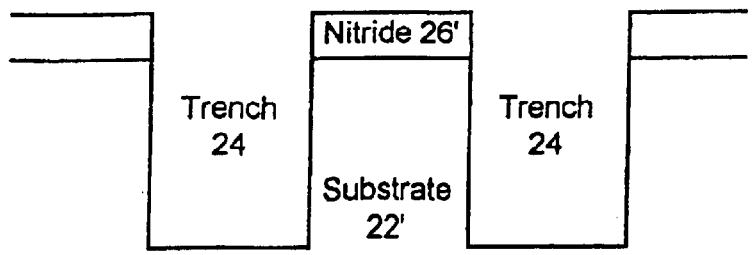
Figure 3F:
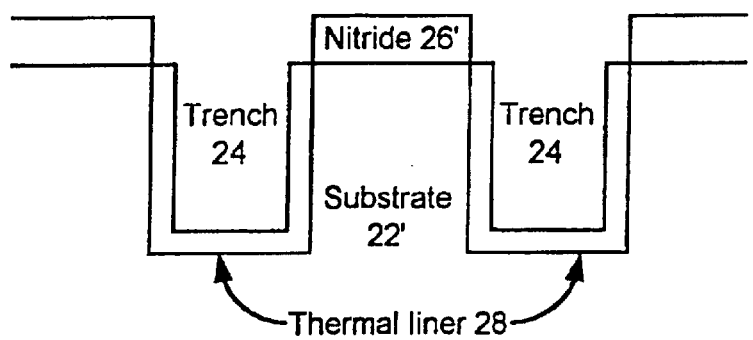
Figure 3G:
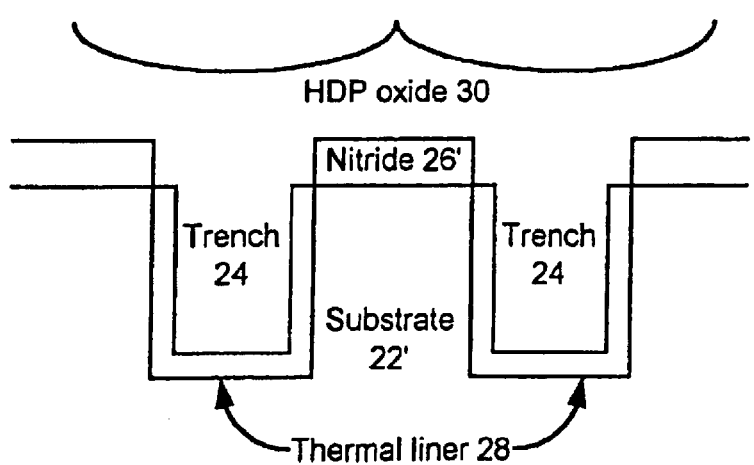

Next, in step 110, the substrate 22 is etched to form isolation trenches 24 (FIG. 3E). A thermal liner 28 is grown in step 112 on the surface of the isolation trenches 24. (FIG. 3F). The thermal liner 28 preferably is a thin oxide layer which operates to relieve stresses at the corners of the isolation trenches 24. Once the thermal liner 28 is in place, the trenches are filled with oxide 30 using an HDP deposition process in step 114. (FIG. 3G). Finally, the oxide 30 is polished back in step 116 and ready for further processing, such as depositing a layer of poly1 to form gate structures.

Figure 1A:
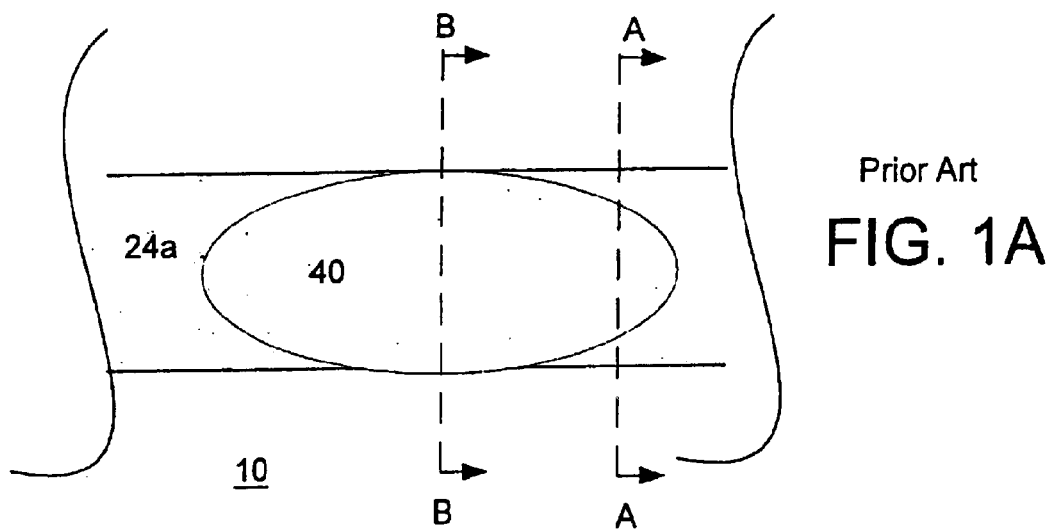
FIGS. 1A–1C are views of one isolation trench line illustrating the defect resulting from depositing oxide using a HDP process.
Figure 1B:
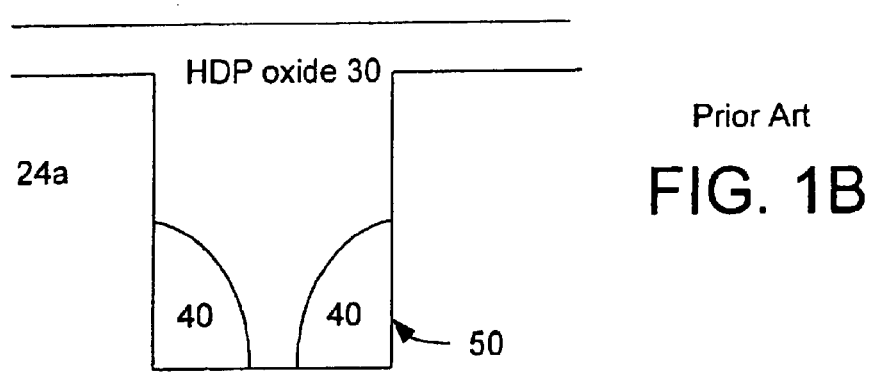
Figure 1C:
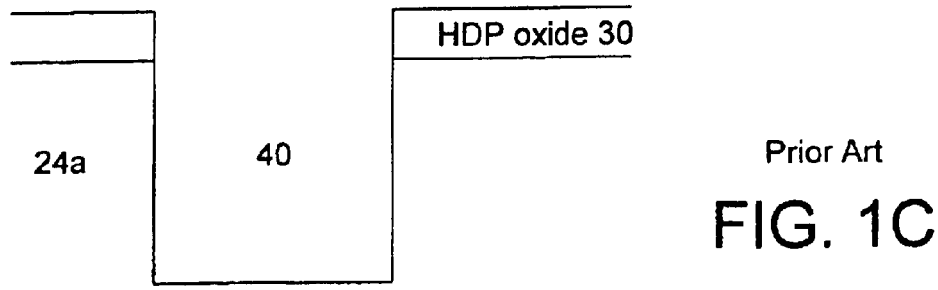

As was discussed above and illustrated in FIGS. 1A–1C, it has been observed that defects 40 in the HDP oxide 30 layer in the isolation trench 24a occur at the surface 50 of the trench 24a. Bubble-like defects 40 tend to start forming at the corners of the trench. These bubbles 40 can grow to the point where they join (FIG. 1B) and eventually encompass the entire trench 24a (FIG. 1C). Thus, when further processing is performed, e.g., fabricating gate structures, the active areas will not be isolated. This defect 40 significantly effects final device yield and performance.

Figure 4:
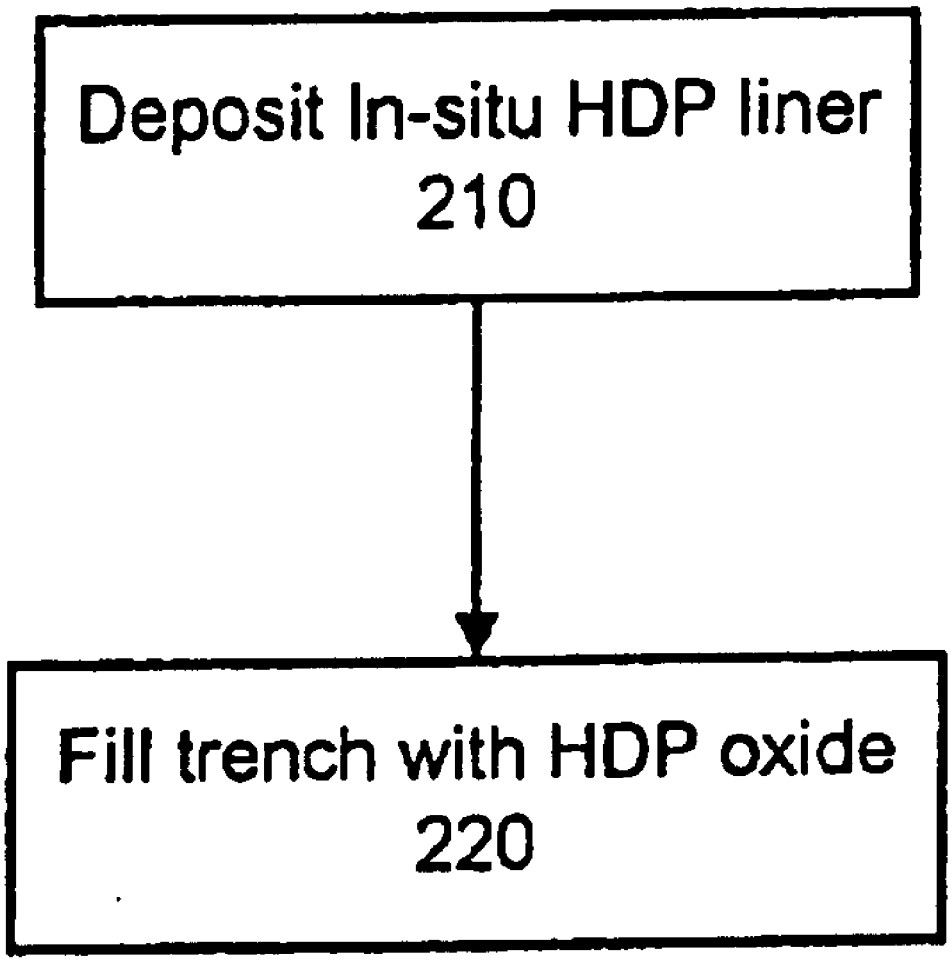
FIG. 4 is a flow chart illustrating the process for filling isolation trenches in accordance with a preferred embodiment of the present invention.
Figure 5A:
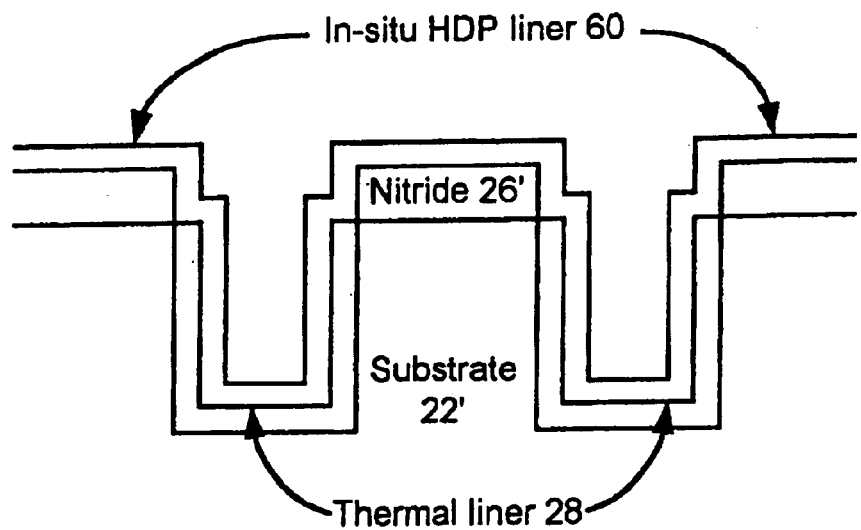
FIGS. 5A and 5B are cross-sectional views of the silicon substrate during the fabrication steps described in FIG. 3.
Figure 5B:
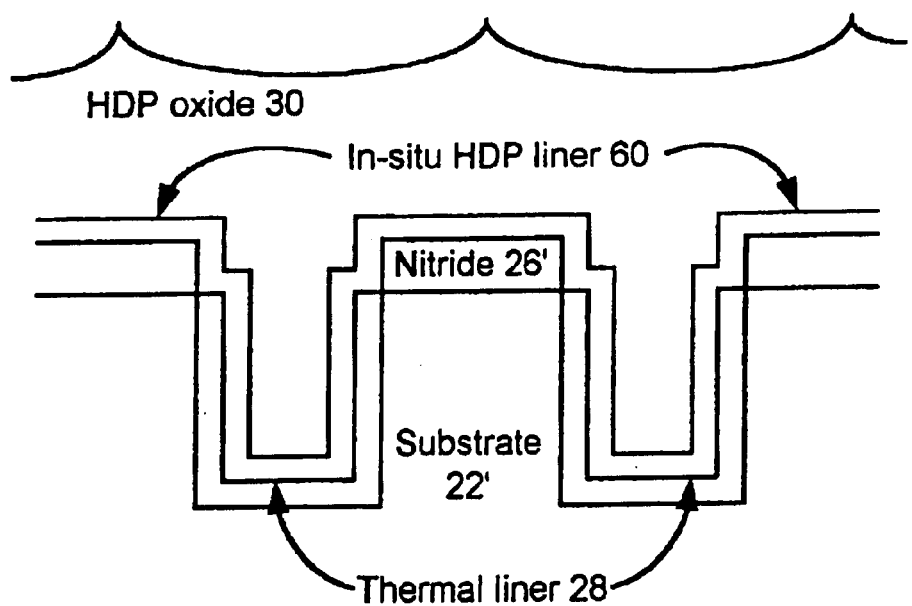

According to the present invention, a two-step isolation trench fill process is provided that includes depositing a thin in-situ HDP liner on the surface of the trench prior to depositing the HDP oxide. FIG. 4 is a flow chart illustrating the process of filling the isolation trench (step 114) in accordance with a preferred embodiment of the present invention. FIGS. 5A and 5B are cross-sectional views of the silicon substrate during the fabrication steps described in FIG. 4. After the thermal liner 28 has been provided on the isolation trench 24 (step 112, FIG. 2), an in-situ HDP liner 60 is deposited in the trenches in step 210 (FIG. 5A).

In a preferred embodiment, the HDP liner 60 is a silicon-rich layer having a thickness of approximately 100 to 400 Angstroms and preferably 200 Angstroms with the following deposition parameters and properties:

Silane (SH4) 100–820 sccm

Oxygen 500–1000 sccm

10–500 sccm

LFRP Power 1500 W–4500 W

HFRP Power 0 W

Helium 100–800 sccm

Pressure 2–6 Torr

Refractive Index 1–47 to 2.1

The silicon-rich layer is deposited in-situ utilizing a non-biased HDP deposition process, similar to plasma enhanced chemical vapor deposition (PECVD). After the silicon-rich HDP liner 60 has been deposited, the trenches are filled with HDP oxide 30 in step 220 (FIG. 3B). The HDP oxide 30 is between 2000 to 8000 Angstroms thick.

Depositing the silicon-rich HDP liner 60 in the trenches helps minimize, if not prevent bubble-like defects, such as those described above, from forming on the trench surface when the HDP oxide 60 is deposited. Thus, the trenches are filled uniformly with high-quality and defect-free oxide.

A two-step isolation trench fill process has been disclosed that includes depositing a silicon-rich HDP liner in the trenches prior to filling the trenches with HDP oxide. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for filling isolation trenches during a semiconductor fabrication process comprising the steps of:

(a) depositing a silicon-rich liner onto the isolation trenches; and (b) filling the isolation trenches with an oxide utilizing a biased high density plasma deposition process;

wherein step (a) further includes the step of depositing a silicon-rich in-situ high density plasma liner in a non-biased environment.

2. The method of claim 1 wherein step (a) further includes the step of providing the silicon-rich liner to a thickness of between 100 and 400 Angstroms.

3. The method of claim 1 wherein step (a) further includes the step of providing the silicon-rich liner to a thickness of approximately 200 Angstroms.

4. The method of claim 1, wherein step (a) further includes the step of depositing the silicon-rich liner utilizing a plasma enhanced chemical vapor deposition process.

5. The method of claim 1 further comprising the step of:

(c) providing a thermal liner prior to depositing the silicon-rich liner.

6. The method of claim 1 further including step of performing isolation trench fill during fabrication of a flash memory array.

7. A method for filling isolation trenches during a semiconductor fabrication process comprising the steps of:

(a) providing a thermal liner on the isolation trenches;

(b) depositing a silicon-rich high density plasma liner having a thickness of between 100 and 400 Angstroms on the thermal liner; and (c) filling the isolation trenches with an oxide utilizing a biased high density plasma deposition process after depositing the silicon-rich high density plasma liner;

wherein step (b) further includes the step of depositing the silicon-rich high density plasma liner utilizing a non-biased high density plasma deposition process.

8. The method of claim 7 wherein step (b) further includes the step of providing the silicon-rich high density plasma liner to a thickness of approximately 200 Angstroms.

9. The method of claim 7, wherein step (b) further includes the step of depositing the silicon-rich high density plasma liner utilizing a plasma enhanced chemical vapor deposition process.

* * * * *